(12) United States Patent
Ueshima

(10) Patent No.: US 7,704,848 B2
(45) Date of Patent: Apr. 27, 2010

(54) METHOD FOR DESIGNING SEMICONDUCTOR DEVICE AND SEMICONDUCTOR DEVICE

(75) Inventor: Takayuki Ueshima, Sakata (JP)

(73) Assignee: Seiko Epson Corporation (JP)

( * ) Notice: Subject to any disclaimer, the term of this patent is extended or adjusted under 35 U.S.C. 154(b) by 244 days.

(21) Appl. No.: 11/843,940

(22) Filed: Aug. 23, 2007

(65) Prior Publication Data

US 2008/0054404 A1 Mar. 6, 2008

(30) Foreign Application Priority Data

Aug. 31, 2006 (JP) .............................. 2006-236014

(51) Int. Cl.
*H01L 21/20* (2006.01)
(52) U.S. Cl. .................. 438/384; 438/3; 438/385; 438/E43.005
(58) Field of Classification Search ......... 257/536–538, 257/784, 295; 438/384–385, 3, 658
See application file for complete search history.

(56) References Cited

U.S. PATENT DOCUMENTS

| 4,484,212 A | * | 11/1984 | Komatsu et al. | ............ 257/536 |
| 5,500,553 A | | 3/1996 | Ikegami | |
| 5,801,960 A | * | 9/1998 | Takano et al. | ................. 716/10 |
| 5,956,592 A | | 9/1999 | Ikegami | |

FOREIGN PATENT DOCUMENTS

| JP | 06-112410 | 4/1994 |
| JP | 06-291259 | 10/1994 |
| JP | 2004-335589 | 11/2004 |
| JP | 2005-064343 | 3/2005 |

* cited by examiner

*Primary Examiner*—Dung A. Le
(74) *Attorney, Agent, or Firm*—Harness, Dickey & Pierce, P.L.C.

(57) ABSTRACT

A method for designing a semiconductor device includes: based on information on layout of a resistive element and information on layout of wiring disposed on a layer above the resistive element when seen in section, determining whether or not the resistive element and the wiring overlap each other when seen from above; and if it is determined that there is an overlap between the resistive element and the wiring when seen from above, changing at least one of the layout of the resistive element and the layout of the wiring so as to eliminate the overlap.

3 Claims, 6 Drawing Sheets

METHOD FOR DESIGNING SEMICONDUCTOR DEVICE AND SEMICONDUCTOR DEVICE

TECHNICAL FIELD

The present invention relates to a method for designing a semiconductor device and a semiconductor device.

RELATED ART

A resistive element built in an integrated circuit (IC) is typically made of polycrystalline silicon. Such a resistive element is formed, for example, following a procedure as shown in FIGS. 6A to 6C. Specifically, as shown in FIG. 6A, a polycrystalline silicon film 53 is formed on a substrate 51 with an insulating film (not shown) therebetween. For example, the polycrystalline silicon film 53 is 2500 Å in thickness and formed using chemical vapor deposition (CVD). Subsequently the polycrystalline silicon film 53 undergoes ion-implantation of, e.g., arsenic (As) so that the resistance value of the film matches a predetermined value. The conditions for implanting As are: implantation energy of 50 KeV and implantation amount of $6.5E14$ $cm^{-2}$.

Subsequently, as shown in FIG. 6B, resist patterns 55 for covering regions on which resistive elements are to be formed and exposing other regions are formed on the polycrystalline silicon film 53. Then, as shown in FIG. 6C, the polycrystalline silicon film 53 is etched with the resist patterns 55 as masks so as to form resistive elements 61, 62. Then, an interlaminar insulating film 71 is formed on the substrate 51 so as to cover the resistive elements 61, 62. Then, metal wiring is formed on the interlaminar insulating film 71 and then sintering is performed on the insulating film 71. For example, the conditions for sintering are: $H_2$ atmosphere, 400° C., and 15 min. See JP-A-2004-335589 and JP-A-2005-64343.

Incidentally the inventors found that if wiring is formed directly above the resistive elements formed in the above-mentioned process, the resistive elements increase their resistance value by 3 to 4% compared to a case in which no such wiring is formed. Specifically, as shown in FIG. 7, if wiring 81 is formed on the interlaminar insulating film 71 and directly above the resistive element 61 in such a manner that the wiring 81 completely covers the resistive element 61, the resistive element 61 demonstrates 3 to 4% higher resistance value than that of the resistive element 62, which is not covered by the wiring 81.

However, in the related-art semiconductor device designing methods, no ingenuity has been used to stabilize the resistance value of a resistive element when laying out wiring disposed on a layer above the resistive element when seen in section. Therefore, the related art designing methods have had a possibility that the resistance value of the resistive element unintentionally may increase depending on the positional relation between the resistive element and wiring.

SUMMARY

An advantage of the invention is to provide a method and a program for designing a semiconductor device and a semiconductor device that each allow variations in resistance value of the resistive element to be reduced.

According to a first aspect of the invention, a method for designing a -semiconductor device includes: based on information on layout of a resistive element and information on layout of wiring disposed on a layer above the resistive element when seen in section, determining whether or not the resistive element and the wiring overlap each other when seen from above; and if it is determined that there is an overlap between the resistive element and the wiring when seen from above, changing at least one of the layout of the resistive element and the layout of the wiring so as to eliminate the overlap.

"The layout of a resistive element" here refers to the shape of the resistive element and the position in which the resistive element is disposed. "The layout of wiring" here refers to the shape of the wiring and the position in which the wiring is disposed. "The information on the layout of a resistive element" and "the information on the layout of wiring" is extracted, for example, from information on design registered with a library. In "the step of changing at least one of the layout of the resistive element and the layout of the wiring," for example, the design is changed by shifting the position in which the resistive element is disposed from below the wiring, changing routing of the wiring so that the wiring does not run directly above the resistive element, or doing otherwise.

According to a second aspect of the invention, a method for designing a semiconductor device includes: based on information on layout of a resistive element and information on layout of wiring disposed on a layer above the resistive element when seen in section, determining whether or not the resistive element and the wiring overlap each other beyond an acceptable range when seen from above; and if it is determined that the resistive element and the wiring overlap each other beyond the acceptable range, changing at least one of the layout of the resistive element and the layout of the wiring so that an extent to which the resistive element and the wiring overlap each other falls at least within the acceptable range.

"The acceptable range" here is represented, for example, by the ratio of the overlap to the area of the resistive element when seen from above.

The methods for designing a semiconductor device according to the first and second aspects of the invention prevent an unintended increase in the resistance value of the resistive element due to the positional relation between the resistive element and the wiring. This reduces variations in the resistance value of the resistive element, thereby helping stabilize the electrical characteristics of the semiconductor device.

Third Aspect

According to a third aspect of the invention, a program for designing a semiconductor device causes a computer to execute: based on information on layout of a resistive element and information on layout of wiring disposed on a layer above the resistive element when seen in section, determining whether or not the resistive element and the wiring overlap each other beyond an acceptable range when seen from above; and if it is determined that the resistive element and the wiring overlap each other beyond the acceptable range, displaying an error.

These features allow the semiconductor designer to take a predetermined countermeasure following such error display. For example, as a countermeasure, the semiconductor designer changes at least one of the layout of the resistive element and that of the wiring so that the extent of the overlap between the resistive element and the wiring falls within the acceptable range.

Fourth Aspect

According to a fourth aspect of the invention, a program for designing a semiconductor device causes a computer to execute: based on information on layout of a resistive element and information on layout of wiring disposed on a layer above the resistive element when seen in section, determining whether or not the resistive element and the wiring overlap each other beyond an acceptable range when seen from above; and if it is determined that the resistive element and the wiring overlap each other beyond the acceptable range, changing at least one of the layout of the resistive element and the layout of the wiring so that an extent to which the resistive element and the wiring overlap each other falls at least within the acceptable range.

These features prevent an unintended increase in the resistance value of the resistive element due to the positional relation between the resistive element and the wiring. This reduces variations in the resistance value of the resistive element, thereby helping stabilize the electrical characteristics of the semiconductor device.

Fifth Aspect

According to a fifth aspect of the invention, a method for designing a semiconductor device includes: based on information on layout of a plurality of resistive elements serving as dividing resistors and information on layout of wiring disposed on a layer above the resistive elements when seen in section, grasping extents of overlaps between the resistive elements and the wiring when seen from above; determining whether or not the grasped extents of the overlaps are mutually matched within an acceptable range; and if it is determined that the grasped extents of the overlaps are not mutually matched, changing at least one of the layout of the resistive elements and the layout of the wiring so that the grasped extents of the overlaps are mutually matched within the acceptable range.

"The dividing resistors" here refer to ones that are a selective combination of multiple resistive elements and divide a voltage so as to generate a predetermined voltage (for example, reference voltage). The resistance ratio between the resistive elements is important in accurately generate the predetermined voltage using the dividing resistors. The resistance ratio between the resistive elements is, for example, 1:1. These resistive elements are coupled selectively, for example, by a switch or a trimming including a transistor, or the like.

The method for designing a semiconductor device according to the fifth aspect of the invention prevents an unintended change in the resistance ratio between the multiple resistive elements serving as dividing resistors due to the respective positional relations between the resistive elements and the wiring. This helps stabilize the electrical characteristics of the semiconductor device.

Sixth Aspect

As a sixth aspect of the invention, the step of changing at least one of the layout of the resistive elements and the layout of the wiring included in the fifth aspect of the invention may include changing the layout of the wiring by adding dummy wiring to the layout of the wiring.

"The dummy wiring" here refers to pseudo-wiring that does not serve as wiring (in other words, is not intended for transmission/reception of signals, power supply, grounding, or the like).

The method for designing a semiconductor device according to the sixth aspect of the invention, for example, eliminates the need to laboriously extend or shorten the wiring through which signals are actually sent, thereby preventing occurrence of signal delay or the like.

Seventh Aspect

According to a seventh aspect of the invention, a program for designing a semiconductor device causes a computer to execute: based on information on layout of a plurality of resistive elements serving as dividing resistors and information on layout of wiring disposed on a layer above the resistive elements when seen in section, grasping extents of overlaps between the resistive elements and the wiring when seen from above; determining whether or not the grasped extents of the overlaps are mutually matched within an acceptable range; and if it is determined that the grasped extents of the overlaps are not mutually matched, changing at least one of the layout of the resistive elements and the layout of the wiring so that the grasped extents of the overlaps are mutually matched within the acceptable range.

These features prevent an unintended change in the resistance ratio of the resistive elements serving as dividing resistors due to the respective positional relations between the resistive elements and the wiring. This helps stabilize the electrical characteristics of the semiconductor device.

Eight Aspect

According to an eighth aspect of the invention, a semiconductor device includes a semiconductor substrate, a resistive element disposed on the semiconductor substrate, an interlaminar insulating film disposed on the semiconductor substrate so as to cover the resistive element, and wiring disposed on the interlaminar insulating film. The resistive element and the wiring do not overlap each other when seen from above.

Ninth and Tenth Aspects

According to a ninth aspect of the invention, a semiconductor device includes a semiconductor substrate, a plurality of resistive elements serving as dividing resistors disposed on the semiconductor substrate, an interlaminar insulating film disposed on the semiconductor substrate so as to cover the resistive elements, and wiring disposed on the interlaminar insulating film. Extents of overlaps between the resistive elements and the wiring when seen from above are mutually matched within an acceptable range.

As a tenth aspect of the invention, the wiring included in the semiconductor device according to ninth aspect of the invention may include dummy wiring that overlaps the resistive elements when seen from above.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Methods and programs for designing a semiconductor device according to embodiments of the invention will now be described with reference to the accompanying drawings.

(1) First Embodiment

Figure 1:
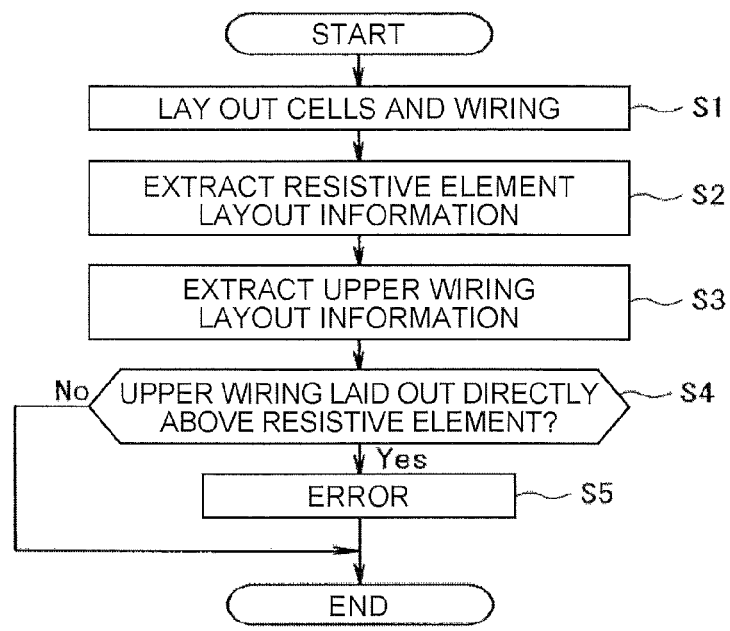
FIG. 1 is a flowchart showing a method for designing the layout of a semiconductor device according to a first embodiment.

FIG. 1 is a flowchart showing a method (program) for designing the layout of a semiconductor device according to a first embodiment of the invention. In the first embodiment, steps S1 to S5 are automatically carried out by a computer. Specifically, in step 1, the layout of cells and wiring (that is, layout design) is automatically carried out using a place and route (P&R) tool. A P&R tool determines the layout of cells, the layout of wiring between the cells, and the like based on information on cells (for example, cells including an NAND circuit, an NOR circuit, a flip-flop, etc.) registered with a library and a netlist indicating information on the connections between the cells.

In step S2, information on the layout of the resistive element is extracted from the information on the layout of the semiconductor device determined in step S1. In step S3, information on the layout of an upper wiring is extracted from the information on the layout of the semiconductor device determined in step S1. The upper wiring here refers to wiring disposed on a layer above the resistive element whose layout information is extracted in step 2 when seen in section.

In step S4, the positional relation between the resistive element and the upper wiring is grasped. Then, it is determined whether or not the upper wiring is disposed directly above the resistive element when seen from above (that is, whether or not the upper wiring runs directly above the resistive element). If the resistive element and the upper wiring overlap each other when seen from above even if only slightly, the process proceeds to step S5. If the resistive element and the upper wiring are completely separated from each other when seen from above (that is, if there is no overlap at all), the flowchart ends. In step S5, for example, the computer displays an error on a monitor screen to notify the semiconductor device designer or the like that there is an error in the layout of the semiconductor device.

Upon receipt of this error notification, for example, the semiconductor device designer per se visually checks the layout of the resistive element and upper wiring. Then, the designer changes at least one of the layout of the resistive element and that of the upper wiring so as to eliminate the overlap between the resistive element and the upper wiring when seen from above (that is, so that the upper wiring does not run directly above the resistive element). The changed layout is additionally written to the information on the layout of the semiconductor device registered with the library.

Figure 4A:
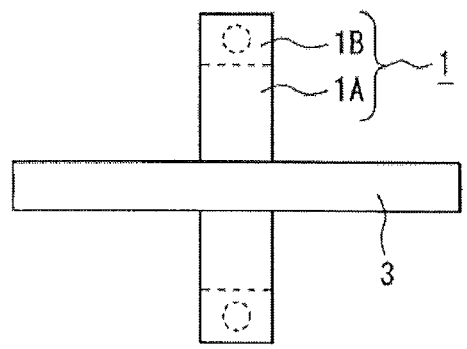
FIGS. 4A to 4C are diagrams showing the positional relations between a resistive element 1 and upper wiring 3 when seen from above.
Figure 4B:
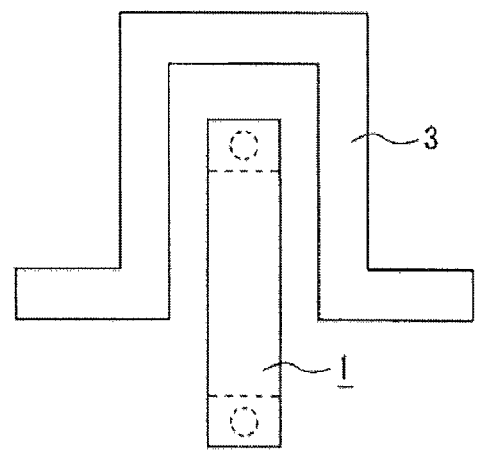

For example, as shown in FIG. 4A, assume that upper wiring 3 made of aluminum (Al), or the like runs directly above a resistive element 1 including a resistive region 1A made of high resistance polysilicon and a contact region 1B made of low resistance polysilicon. In this case, the designer changes the design so that the resistive element 1 and the upper wiring 3 do not intersect each other, by changing the routing of the upper wiring 3 as shown in FIG. 4B, shifting the layout of the resistive element 1 from below the upper wiring 3 as indicated by the arrow in FIG. 4C, or doing otherwise.

Figure 4C:
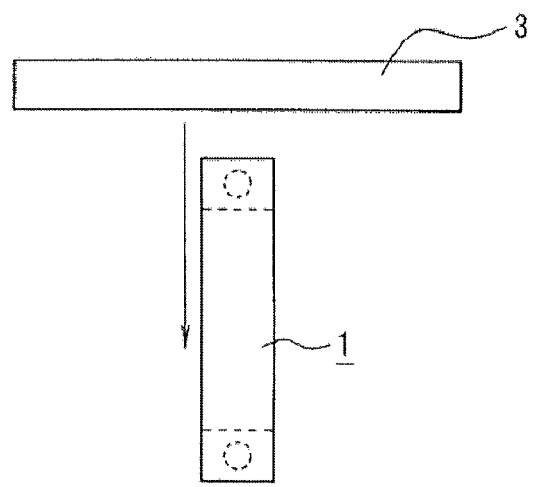

As described above, the first embodiment of the invention prevents the resistance value of the resistive element from unintentionally increasing depending on the positional relation between the resistive element and the upper wiring. This reduces variations in resistance value of the resistive element, helping stabilize the electrical characteristic of the semiconductor device. For example, if the resistance value of the resistive element is important in terms of design (that is, the absolute value of the resistance value is used in design), not laying out the resistive element 1 directly below the upper wiring 3 as shown in FIGS. 4B and 4C prevents an increase in resistance value of the resistive element 1. Thus, for example, a desired analog characteristic is obtained.

Incidentally, in the above-mentioned first embodiment, it is exactly determined in step S4 of FIG. 1 whether or not the upper wiring is disposed directly above the resistive element. In other words, if the resistive element and the upper wiring overlap each other when seen from above even if only slightly, it is determined that there is an error in the design and the process proceeds from step S4 to step S5 (that is, an error is displayed).

However, if the resistive element has some leeway in its resistance value characteristic and if it is expected that some increase in resistance value will not have much influence on the electrical characteristics of the semiconductor device, the determination criterion for step S4 may be relaxed to some extent. Specifically, as a determination criterion for step S4, an acceptable range of the extent to which the resistive element and the upper wiring overlap each other may previously be set up and inputted into the computer. Then, in step S4, whether or not the resistive element and the upper wiring overlap each other beyond the acceptable range when seen from above may be determined by the computer.

"The acceptable range" here is represented, for example, by the ratio of "the area of an overlap between the resistive element and the upper wiring" to "the area of the resistive element." The ratio is determined based on a simulation, experience, or the like. Specifically, for example, if 5% or more of the area of the resistive element overlaps the upper wiring, it is determined that there is an error in the design and the process proceeds to step S5. These features allow the process to proceed to step S5 without damaging the electrical characteristics of the semiconductor device. Thus the efficiency in designing the semiconductor device is further enhanced.

(2) Second Embodiment

As described in the first embodiment, the computer displays an error on a monitor screen in step S5 of FIG. 1 and then designer per se checks the layout of the resistive element and the upper wiring. Then the designer changes at least one of the layout of the resistive element and that of the upper wiring so as to eliminate the overlap between the resistive element and the upper wiring when seen from above. However, such layout change may be carried out by the computer automatically rather than the designer per se. Such a case will be described in a second embodiment.

Figure 2:
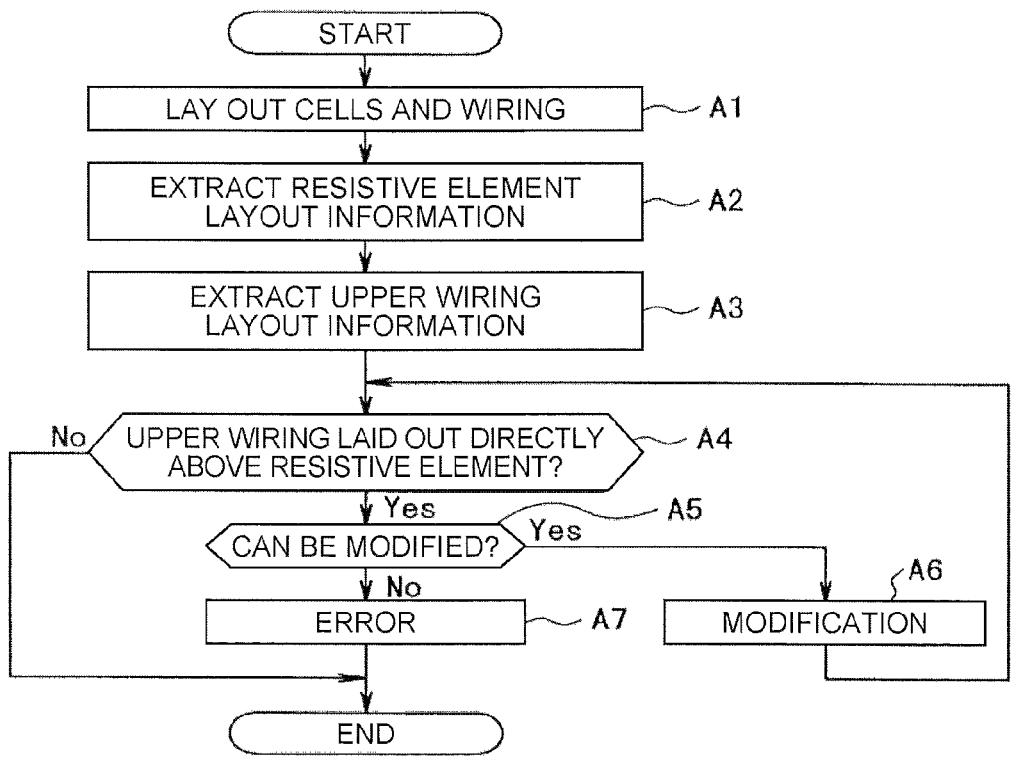
FIG. 2 is a flowchart showing a method for designing the layout of a semiconductor device according to a second embodiment.

FIG. 2 is a flowchart showing a method (program) for designing the layout of a semiconductor device according to the second embodiment of the invention. In the second embodiment, steps A1 to A7 of FIG. 2 are automatically carried out by the computer. Steps A1 to A4 are similar steps to S1 to S4 of FIG. 1.

Specifically, in step A1 of FIG. 2, the layout is automatically designed using a P&R tool. In step A2, information on the layout of the resistive element is extracted from the information on the layout of the semiconductor device determined in step A1. In step S3, information on the layout of the upper wiring is extracted from the information on the layout of the semiconductor device. The upper wiring here refers to wiring disposed on a layer above the resistive element whose layout information is extracted in step A2 when seen in section.

In step A4, the positional relation between the resistive element and the upper wiring is grasped. Then, it is determined whether or not the upper wiring is disposed directly above the resistive element when seen from above. If the resistive element and the upper wiring overlap each other when seen from above even if only slightly, the process proceeds to step A5. If the resistive element and the upper wiring are completely separated from each other when seen from above, the flowchart ends.

In step A5, it is determined whether or not changing at least one of the layout of the resistive element and that of the upper wiring allows the resistive element and the upper wiring to be completely separated from each other when seen from above (that is, whether or not the layout can be modified). If the layout can be modified, the process proceeds to step A6. If not, the process proceeds to step A7.

In step A6, at least one of the layout of the resistive element and that of the upper wiring is automatically changed so as to eliminate the overlap between the resistive element and the upper wiring when seen from above (in other words, so that the upper wiring does not run directly above the resistive element). Then, the changed layout is additionally and automatically written to the information on the layout of the semiconductor device registered with the library. On the other hand, in step A7, for example, the computer displays an error on a monitor screen to notify the semiconductor device designer or the like that there is an error (that cannot be modified automatically) in the layout.

As described above, the second embodiment of the invention allows the layout of the resistive element or the upper wiring to be automatically changed by the computer. This reduces time and work taken to design the semiconductor device.

(3) Third Embodiment

If the resistance value of the resistive element is important in terms of design (that is, the absolute value of the resistance value is used in design), not overlapping the resistive element and the upper wiring with each other when seen from above as shown in the first and second embodiments prevents an unintended increase in resistance value of the resistive element. However, if multiple resistive elements are used as dividing resistors, the resistance ratio between the resistive elements is more important than the respective resistance values of the resistive elements.

Figure 5A:
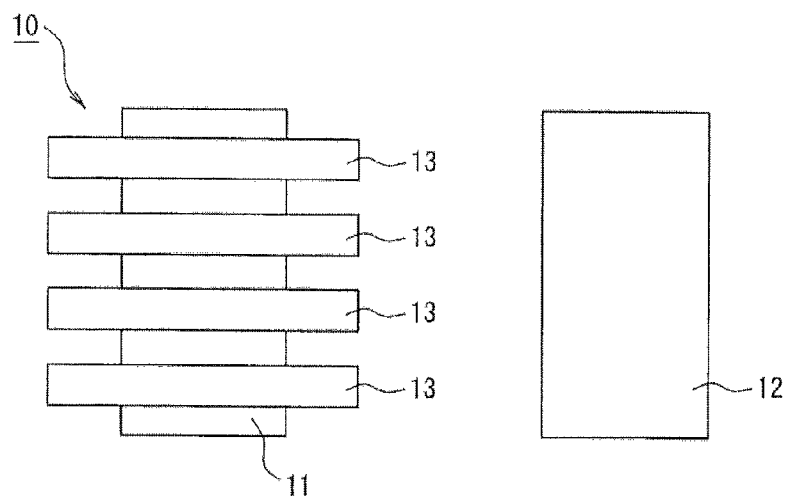
FIGS. 5A to 5C are diagrams showing the positional relations between resistive elements 11, 12 and upper wiring 13, 14, respectively, when seen from above.
Figure 5B:
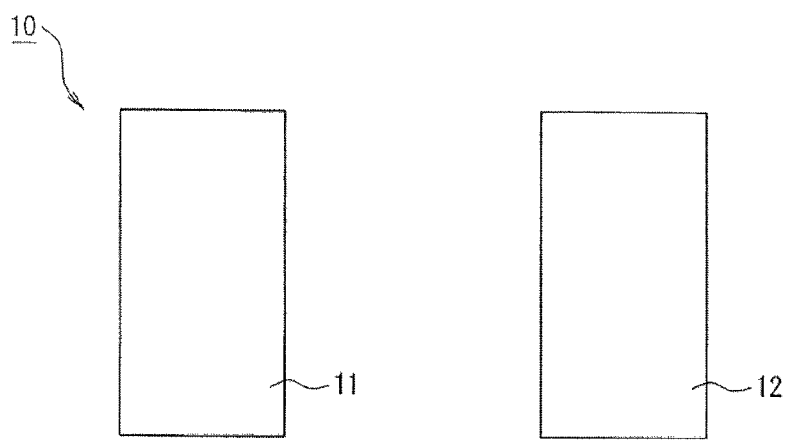

Specifically, as shown in FIG. 5A, assume that there are multiple resistive elements serving as dividing resistors 10 and that pieces of upper wiring 13 are disposed only directly above a first resistive element 11. As shown in FIG. 5B, changing the layout of the wiring so that the pieces of upper wiring 13 are eliminated from above the first resistive element 11 allows the resistance ratio between the resistive elements 11, 12 to be leveled so as to be 1:1. Here, it is assumed that the resistive elements 11, 12 are designed, for example, so as to be identical to each other in shape and size when seen from above, thickness, and material and have an identical resistance value.

Figure 5C:
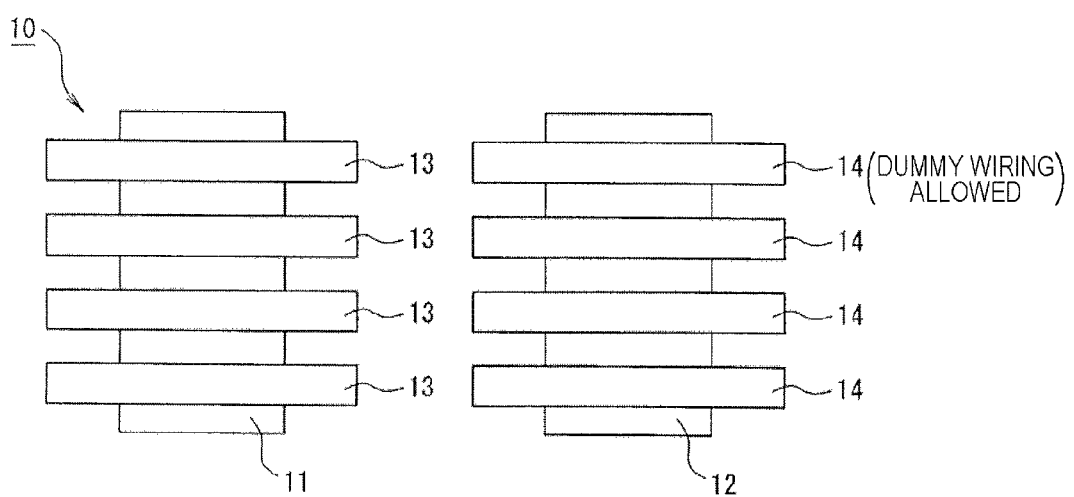
Figure 6A:
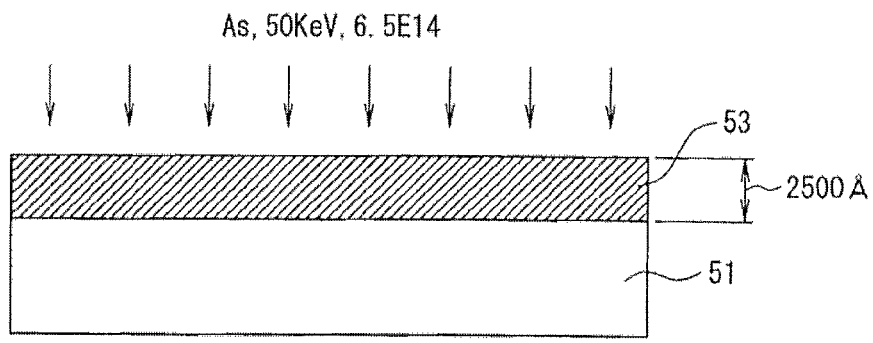
FIGS. 6A to 6C are diagrams showing a method for manufacturing resistive elements 61, 62.
Figure 6B:
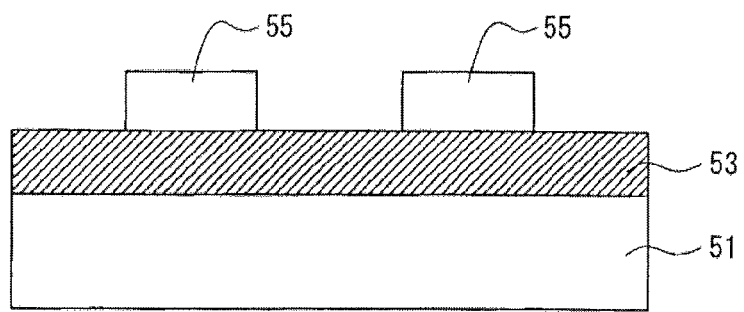
Figure 6C:
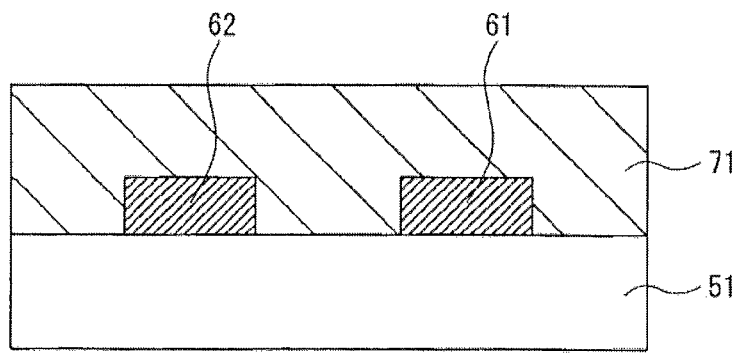
Figure 7:
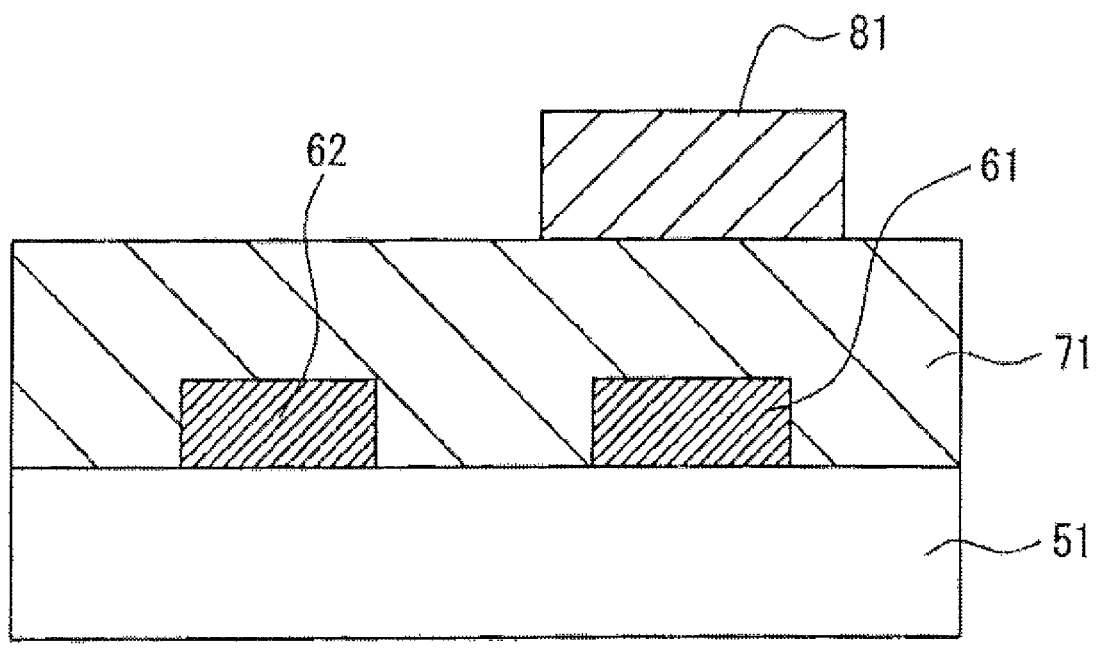
FIG. 7 is a diagram showing a problem found by the inventors.

Alternatively, as shown in FIG. 5C, laying out pieces of wiring 14 directly above a second resistive element 12 serving as one of the dividing resistors 10 allows the resistance ratio between the resistive elements 11, 12 to be leveled so as to be 1:1. Specifically, as shown in FIG. 5C, the pieces of wiring 14 that are the same in shape and area as the pieces of upper wiring 13 disposed directly above the resistive element 11 are disposed directly above the resistive element 12 by the same number of pieces as the upper wiring 13. The pieces of wiring 14 may be formed by routing the upper wiring 13 to directly above the resistive element 12 or may be dummy wiring. In the third embodiment, such a case will be described.

Figure 3:
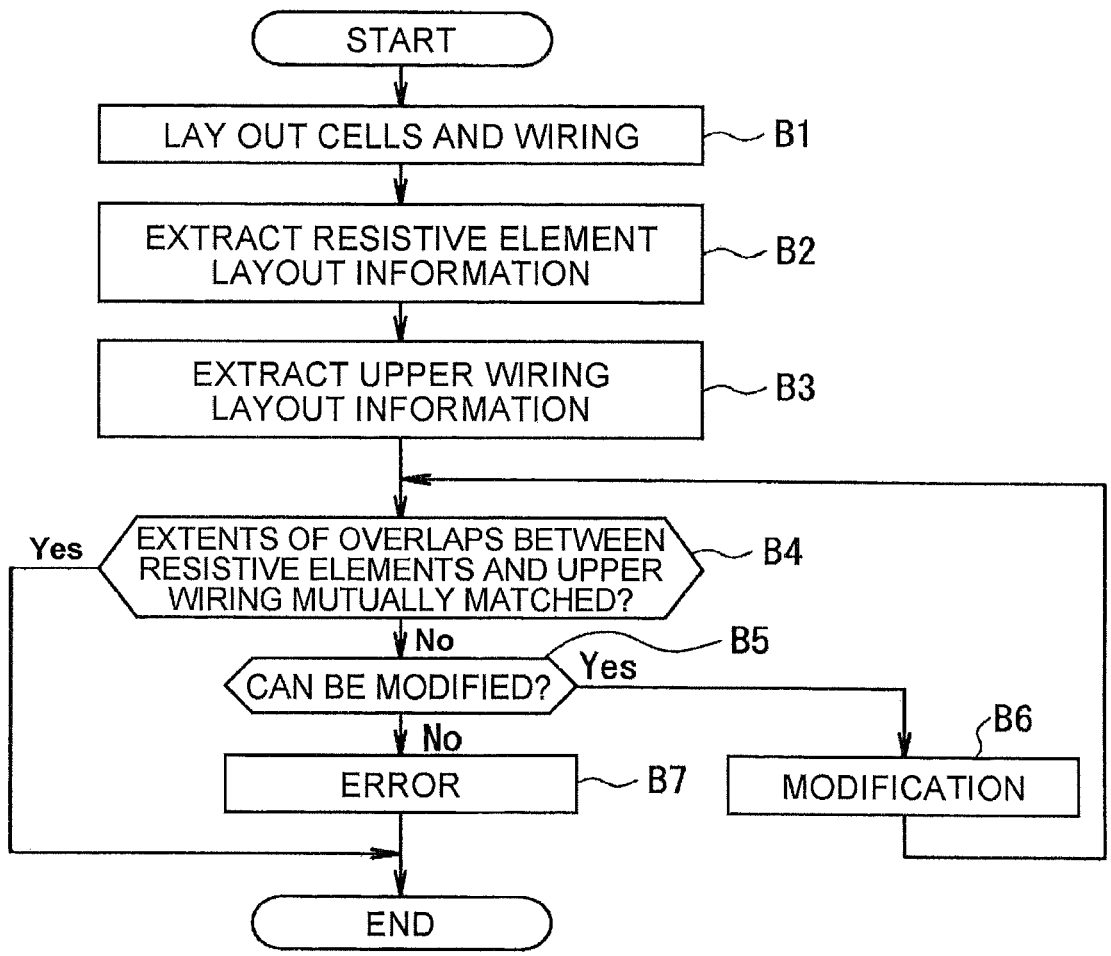
FIG. 3 is a flowchart showing a method for designing the layout of a semiconductor device according to a third embodiment.

FIG. 3 is a flowchart showing a method (program) for designing the layout of a semiconductor device according to the third embodiment of the invention. In the third embodiment, steps B1 to B7 of FIG. 3 are automatically carried out by the computer.

Specifically, in step B1 of FIG. 3, the layout is automatically designed using a P&R tool. In step B2, information on the layout of multiple resistive elements serving as dividing resistors is extracted from the information on the layout of the semiconductor device determined in step B1. In step B3, information on the layout of the upper wiring is extracted from the information on the layout of the semiconductor device determined in step B1. The upper wiring here refers to wiring disposed on a layer above the dividing resistors whose layout information is extracted in step B2 when seen in section.

In step B4, the respective positional relations between the resistive elements and the upper wiring are grasped, for example, based on information on the layout of the multiple resistive elements serving as dividing resistors and information on that of the upper wiring. Then, it is determined whether or not the extents of the respective overlaps between the resistive elements and the upper wiring are mutually matched within the acceptable range.

The "acceptable range" here is represented, for example, by the ratio between the areas, and the values of the areas are determined based on a simulation, experience, or the like. Specifically, assume that the area of the overlap between a first resistive element and the upper wiring is a first area and that the area of the overlap between a second resistive element and the upper wiring is a second area. For example, if the difference between the first and second areas is 5% or more of the first area, it is determined that there is an error in the design and the process proceeds to step B5.

If it is determined in step B4 that the extents of the respective overlaps between the resistive elements and the upper wiring are mutually matched, the flowchart of FIG. 3 ends. If it is determined that the extents of the overlaps are not mutually matched, the process proceeds to step B5.

In step B5, it is determined whether or not changing at least one of the layout of the resistive elements serving as dividing resistors and the layout of the upper wiring allows the extents of the respective overlaps between the resistive elements and the upper wiring to be mutually matched (in other words, whether or not the layout can be modified). If the layout can be modified, the process proceeds to step B6. If not, the process proceeds to step B7.

In step B6, at least one of the layout of the resistive elements and that of the upper wiring is automatically changed so that the extents of the overlaps between the resistive elements and the upper wiring are mutually matched within the acceptable range. Here, a change to the layout of the upper wiring is made by eliminating the pieces of the upper wiring 13 from directly above the resistive element 11 as shown in FIG. 5B, laying out the pieces of upper wiring 14 directly above the second resistive element 12 as shown in FIG. 5C, or doing otherwise.

As described above, if the wiring 14 is disposed directly above the resistive element 12, the pieces of upper wiring 13, which run directly above the resistive element 11, may be extended to directly above the resistive element 12 and used as the pieces of upper wiring 14. Alternatively, dummy wiring may be used as the pieces of upper wiring 14. Then the changed layout is additionally written to the information on the layout of the semiconductor device registered with the library. On the other hand, in step B7, for example, the computer displays an error on a monitor screen to notify the semiconductor device designer or the like that there is an error (that prevents automatic modification of the layout) in the layout.

As described above, the third embodiment of the invention prevents an unintended change in the resistance ratio between the multiple resistive elements serving as dividing resistors due to the respective positional relations between the resistive elements and the wiring. This helps stabilize the electrical chrematistics of the semiconductor device. Eliminating the difference in resistance between the resistive elements allows, for example, a desired analog characteristic to be obtained.

The entire disclosure of Japanese Patent Application No. 2006-236014, filed Aug. 31, 2006 is expressly incorporated by reference herein.

What is claimed is:

1. A method for designing a semiconductor device, comprising:

based on information on a layout of a resistive element and information on a layout of wiring disposed on every layer above the resistive element when seen in section, determining whether or not the resistive element and the wiring overlap each other when seen from above;

determining a ratio of overlap between the resistive element and the wiring when the resistive element and the wiring overlap each other; and changing at least one of the layout of the resistive element and the layout of the wiring so as to eliminate the overlap when the ratio of overlap is greater than a threshold ratio corresponding to a threshold variation in a resistance of the resistive element.

2. A method for designing a semiconductor device, comprising:

based on information on a layout of a plurality of resistive elements serving as dividing resistors and information on a layout of wiring disposed on every layer above the resistive elements when seen in section, determining ratios of overlap between the wiring and each of the resistive elements;

determining whether or not differences between the ratios are less than a threshold difference corresponding to a threshold resistance ratio between the resistive elements; and changing at least one of the layout of the resistive elements and the layout of the wiring so that the differences are less than the threshold difference.

3. The method for designing a semiconductor device according to claim 2, wherein the step of changing at least one of the layout of the resistive elements and the layout of the wiring includes changing the layout of the wiring by adding dummy wiring to the layout of the wiring.

* * * * *